(12) United States Patent
Dasgupta et al.

(10) Patent No.: US 10,332,998 B2
(45) Date of Patent: Jun. 25, 2019

(54) TRANSISTORS WITH HETEROEPITAXIAL III-N SOURCE/DRAIN

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/779,070

(22) PCT Filed: Dec. 24, 2015

(86) PCT No.: PCT/US2015/000497
§ 371 (c)(1),
(2) Date: May 24, 2018

(87) PCT Pub. No.: WO2017/111871
PCT Pub. Date: Jun. 29, 2017

(65) Prior Publication Data
US 2018/0350985 A1 Dec. 6, 2018

(51) Int. Cl.
*H01L 21/336* (2006.01)
*H01L 29/267* (2006.01)
(Continued)

(52) U.S. Cl.
CPC ...... *H01L 29/7848* (2013.01); *H01L 21/0254* (2013.01); *H01L 21/02645* (2013.01);
(Continued)

(58) Field of Classification Search
None
See application file for complete search history.

(56) References Cited

U.S. PATENT DOCUMENTS

| 7,592,213 B2 * | 9/2009 | Datta | H01L 21/82380 257/E21.632 |
| 8,232,172 B2 * | 7/2012 | Adam | H01L 21/26513 438/300 |

(Continued)

OTHER PUBLICATIONS

International Search Report and Written Opinion for International Patent Application No. PCT/US2015/000497, dated Sep. 23, 2016.
(Continued)

*Primary Examiner* — Minh Loan Tran
(74) *Attorney, Agent, or Firm* — Green, Howard & Mughal LLP

(57) ABSTRACT

Transistors including doped heteroepitaxial III-N source/drain crystals. In embodiments, transistors including a group IV or group III-V channel crystal employ n+ doped III-N source/drain structures on either side of a gate stack. Lateral tensile strain of the channel crystal may result from lattice mismatch between the channel crystal and the III-N source/drain crystals. In embodiments, an amorphous material is employed to limit growth of III-N material to only a single channel crystal facet, allowing a high quality monocrystalline source/drain to form that is capable of sustaining significant stress. In some embodiments, an n+ III-N source/drain crystal is grown on a (110) or (111) surface of a silicon channel crystal fabricated into a fin structure to form a tensile strained NMOS finFET.

21 Claims, 14 Drawing Sheets

(51) Int. Cl.

| | |
|---|---|
| *H01L 29/78* | (2006.01) |
| *H01L 21/8238* | (2006.01) |
| *H01L 29/66* | (2006.01) |
| *H01L 27/092* | (2006.01) |
| *H01L 29/04* | (2006.01) |
| *H01L 29/205* | (2006.01) |
| *H01L 21/02* | (2006.01) |
| *H01L 29/08* | (2006.01) |
| *H01L 29/16* | (2006.01) |
| *H01L 29/20* | (2006.01) |
| *H01L 21/8258* | (2006.01) |

(52) U.S. Cl.
CPC ............... *H01L 21/823807* (2013.01); *H01L 21/823814* (2013.01); *H01L 21/823821* (2013.01); *H01L 27/092* (2013.01); *H01L 27/0924* (2013.01); *H01L 29/045* (2013.01); *H01L 29/0847* (2013.01); *H01L 29/16* (2013.01); *H01L 29/2003* (2013.01); *H01L 29/205* (2013.01); *H01L 29/267* (2013.01); *H01L 29/66522* (2013.01); *H01L 29/66545* (2013.01); *H01L 29/66636* (2013.01); *H01L 29/66795* (2013.01); *H01L 29/7851* (2013.01); *H01L 21/8258* (2013.01)

(56) References Cited

U.S. PATENT DOCUMENTS

| | | | |
|---|---|---|---|
| 8,236,659 B2 * | 8/2012 | Tsai | H01L 21/26586 |
| | | | 257/E21.619 |
| 9,978,650 B2 * | 5/2018 | Cheng | H01L 29/66795 |
| 2005/0148147 A1 | 7/2005 | Keating | |
| 2007/0155063 A1 | 7/2007 | Datta et al. | |
| 2011/0159655 A1 | 6/2011 | Adam et al. | |
| 2011/0312145 A1 | 12/2011 | Tsai et al. | |
| 2014/0264493 A1 | 9/2014 | Cheng et al. | |
| 2018/0350921 A1 * | 12/2018 | Dasgupta | H01L 27/0924 |

OTHER PUBLICATIONS

International Preliminary Report on Patentability for International Patent Application No. PCT/US15/00497, dated Jul. 5, 2018.

* cited by examiner

TRANSISTORS WITH HETEROEPITAXIAL III-N SOURCE/DRAIN

CLAIM OF PRIORITY

This Application is a National Stage Entry of, and claims priority to, PCT Application No. PCT/US15/00497, filed on 24 Dec. 2015 and titled "TRANSISTORS WITH HETEROEPITAXIAL III-N SOURCE/DRAIN", which is incorporated by reference in its entirety for all purposes.

BACKGROUND

Integrated circuits (ICs) continue to scale dimensionally. Over recent generations of silicon-based CMOS transistors, various techniques have been employed to obtain higher transistor drive current as dimensions shrink. Tensile strain in the channel can reduce the effective mass of charge carriers in an n-channel transistor. Compressive strain in a channel can reduce the effective mass of charge carriers in a p-channel transistor. With reductions in effective mass, charge carrier velocity increases and drive current improves. Transistor channels have been strained by introducing various stressors proximate to the channel, for example highly-stressed $Si_3N_4$ liners have been deposited over transistors, and/or source/drain regions with crystal lattice mismatch have been utilized.

However, the levels of stress required to induce sufficient channel strain for band splitting to occur is high, typically in the 1-2 MPa range. While such high stress could be achieved by various means in planar devices, it is more difficult to do so in non-planar, finFET architectures. This is particularly true for n-channel silicon devices as it is difficult to incorporate material having a lattice constant significantly smaller than that of silicon. Silicon doped with 1-2% C (Si:C), for example, typically does not introduce sufficient channel strain.

Transistor architectures, and methods of fabricating such transistors, capable of imparting significant strain in a transistor channel crystal, particularly tensile strain, are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
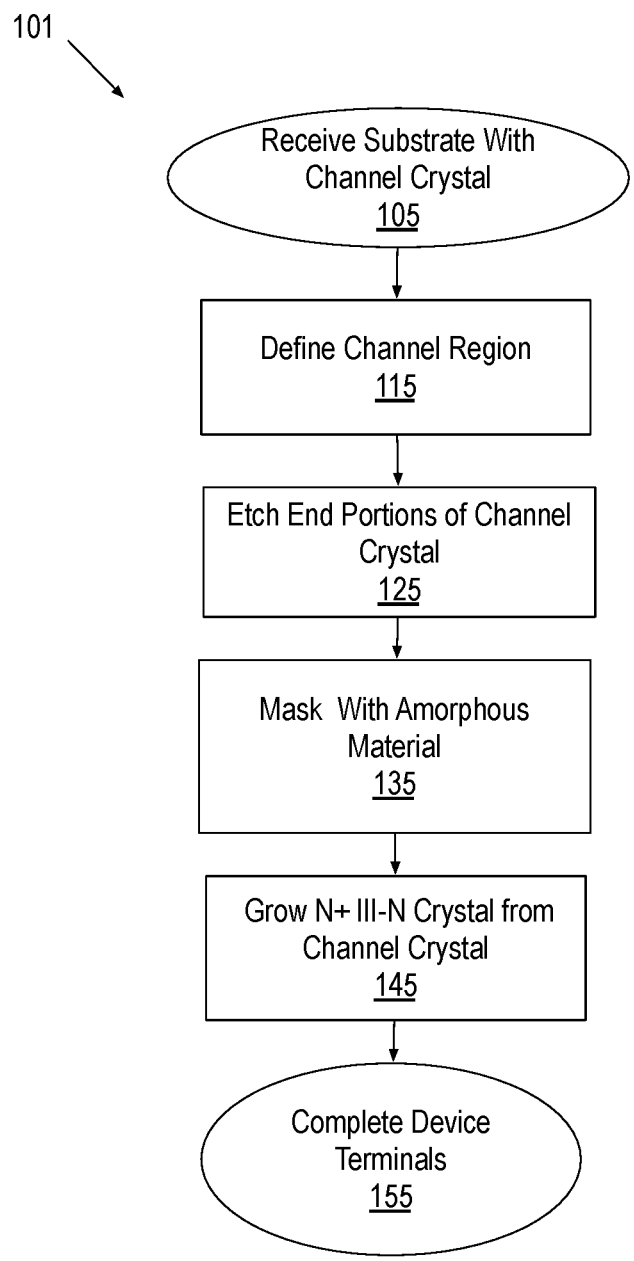
FIG. 1 is a flow diagram illustrating methods of forming a transistor with a heteroepitaxial III-N source and drain, in accordance with embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring features of various embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are source and/or drain (i.e., source/drain) structures including one or more doped III-N semiconductor crystal grown on a non-III-N channel crystal. The III-N crystals are operable as the source and/or drain of a transistor that further employs a gate stack to modulate conductivity within the channel crystal. The heteroepitaxial III-N source/drain crystals may be heavily doped and have a III-N alloy composition with advantageously low sheet resistance and band offset from the channel crystal. The III-N crystal has a smaller lattice constant than that of the channel crystal to impart strain on the channel crystal. In some embodiments, the channel crystal is a group IV semiconductor (e.g., Si, Ge, or SiGe). In other embodiments, the channel crystal is a group III-V semiconductor (e.g., GaAs, InP, InAs, etc.). In advantageous embodiments, for at least the reason of lattice mismatch, the III-N source/drain crystals are to induce tensile strain within the channel crystal. Thermal mismatch (e.g., mismatch in linear thermal expansion coefficients) between the source/drain crystal and channel crystal may also play a role as both effects may be complementary with respect to placing a pseudomorphic III-N source/drain crystal under tensile stress. There is a CTE mismatch of ~116% between Si and GaN, for example. Regardless of the origin, a tensile stress in the III-N source/drain crystal may be leveraged to induce a tensile strain in the channel crystal, at least a portion of which is advantageously in a lateral direction extending between the source and drain.

In some embodiments, the III-N (e.g., GaN, InN, AlN, InGaN and AlGaN) source/drain semiconductor has hexagonal crystallinity with a c-axis substantially orthogonal to a seeding surface of the channel crystal from which the III-N crystal is grown. Depending on the III-N composition, the c-plane lattice constant a varies between about 0.32 nm and 0.35 nm. Many other semiconductor crystals have significantly larger values of the a lattice parameter. For example, a is approximately 0.543 nm in silicon (Si). Alloys of SiGe are even larger as a function of the Ge concentration. Group III-V alloys such as GaP, GaAs, InP, InAs, and InSb all have a lattice constant a that is at least as large as that of Si. As such, III-N crystals may be employed to introduce significant strain in any of these materials. In some embodiments where a transistor employs one of these exemplary group IV or group III-V crystals as a channel, a doped III-N crystal as a source and/or drain disposed on either side of the channel induces the 1-2 GPa of stress needed to strain the channel crystal and induce band splitting for a reduced carrier effective mass.

The III-N source/drain crystal forms a heterojunction with the channel crystal and for exemplary group IV and group III-V channel crystals, there is crystal asymmetry at the heterojunction in addition to a compositional asymmetry. For example, a channel crystal may have cubic or zinc blende crystallinity while the III-N source/drain crystal is hexagonal. In some exemplary embodiments, this crystal asymmetry is managed by limiting the III-N crystal growth to select surfaces (e.g., facets) of the channel crystal. Hence, while any number of channel crystal facets may be readily employed as seeding surfaces for a source/drain crystal that is also cubic or zinc-blende, III-N crystal quality is superior where the III-N crystal growth is limited to a single channel crystal surface. Better III-N crystal quality is advantageously more stressed. For an exemplary silicon channel crystal, III-N growth is advantageously restricted to a (111) surface or a (110) surface. Both of these surfaces can support growths of a pseudomorphic III-N crystal and have sufficient lattice mismatch (~17% lattice mismatch for the (111) surface and as much as 30% for the (110) surface) for the III-N crystal to apply 1-2 GPa of stress on the channel crystal in either a planar or non-planar (e.g., finFET or nanowire) transistor architecture. Furthermore, these facets do not pose the extreme lattice mismatch of (100) silicon, which is approximately 41%, and thus are relatively less challenging to grow with low defect densities less than $1 \times 10^{11}$ cm$^{-2}$.

In some embodiments, a gate stack is disposed over a (100) surface of the channel crystal with the doped III-N source/drain crystal disposed at opposite ends of the channel crystal. An amorphous material may be disposed relative to a seeding surface of the channel crystal, for example to avoid polycrystalline or highly defective growth of the III-N source/drain crystal. In some embodiments, lateral growth of the III-N source/drain crystal over the amorphous material is promoted while the amorphous material blocks competitive growths that might otherwise be nucleated.

FIG. 1 is a flow diagram illustrating methods 101 for forming a transistor with a heteroepitaxial III-N source and drain, in accordance with embodiments. Methods 101 may be practiced to form planar or non-planar embodiments of the field effect transistor (FET) 201 illustrated in FIG. 2. Illustrated in plan view, FET 201 includes source/drain metallization 250 embedded in an inter-layer dielectric (ILD) 280 and contacting doped III-N semiconductor crystal. The doped III-N crystal is further contacting a channel crystal 231 that is disposed on a substrate 205. Channel crystal 231 has a current carrying width that is at least partially dependent on width $W_1$, with current carrying width of non-planar devices further dependent on a vertical height (e.g., z-dimension) of the channel crystal 231. A gate stack including a gate electrode 240 is further disposed on a portion of the channel crystal 231 between the source/drain metallization 250.

Figure 2:
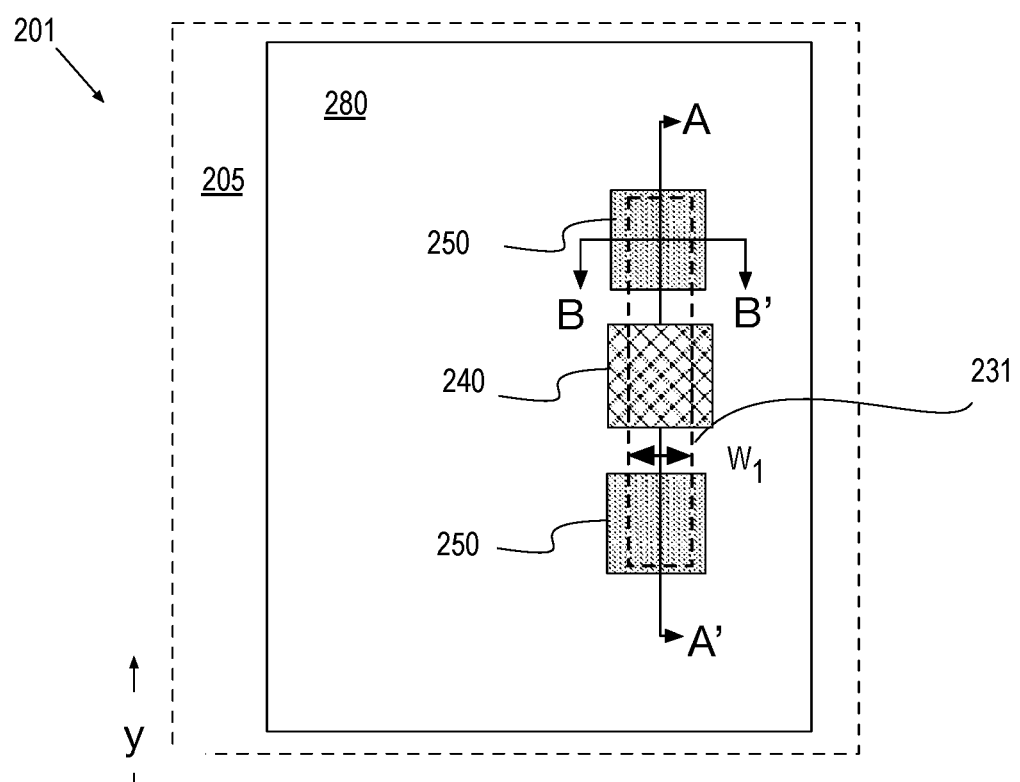
FIG. 2 is a plan view of a transistor with a heteroepitaxial III-N source and drain, in accordance with embodiments.

As shown in FIG. 2, the A-A' line passes through a longitudinal length of channel crystal and source/drain crystal, while the B-B' line passes through a transverse length of the source/drain crystal. In one exemplary embodiment where the substrate is (100) silicon, the A-A' line is aligned with a <110> direction of the substrate. FIGS. 3A-11B provide cross-sectional views along either the A-A' line or the B-B' line illustrated in FIG. 2, and are referenced in the below description of methods 101 (FIG. 1) to illustrate various planar and non-planar embodiments of FET 201.

Referring again to FIG. 1, methods 101 begin with receiving a substrate including a channel crystal at operation 105. Various epitaxial growth processes and/or patterning processes may be employed upstream of methods 101 to prepare the substrate received at operation 105. For exemplary group IV channel crystals, the substrate received at operation 105 may comprise only group-IV materials (e.g., Si, Ge, SiGe). Crystallographic orientation is (100) for some substantially monocrystalline silicon substrate embodiments. However, other crystallographic orientations are also possible, such as but not limited to (111), or (110). For other exemplary group III-V channel crystals, the substrate received at operation 105 may comprise one or more layer of III-V semiconductor crystal epitaxially grown on a heterogeneous substrate, such as a silicon substrate. Other substrate materials are also possible, with examples including silicon carbide (SiC), sapphire, a III-V compound semiconductor (e.g., GaAs, InP), a semiconductor on insulator (SOI), or other "non-bulk" substrate.

Figure 3A:
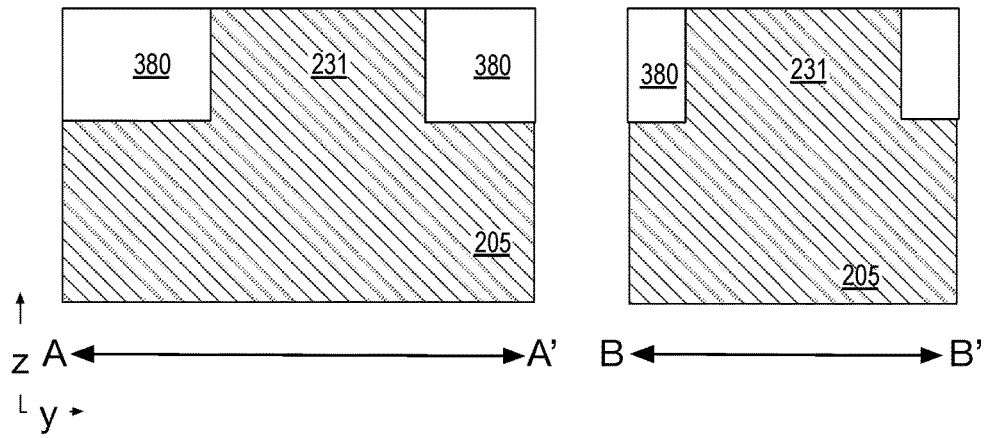
FIGS. 3A, 4A, 5A, 6A, 7A, and 8A are cross-sectional views of planar transistor structures as selected operations in the method illustrated in FIG. 1 are performed, in accordance with some embodiments.
Figure 3B:
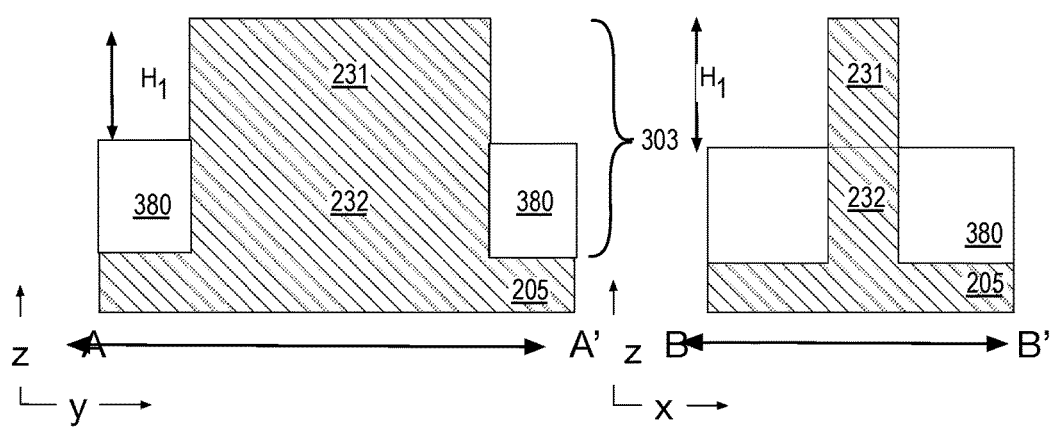
FIGS. 3B, 4B, 5B, 6B, 7B, and 8B are cross-sectional views of non-planar transistor structures as selected operations in the method illustrated in FIG. 1 are performed, in accordance with some embodiments.

FIG. 3A illustrates a cross-sectional view along the A-A' and B-B' lines from FIG. 2 for a planar transistor, in accordance with some embodiments. In the exemplary embodiment illustrated, channel crystal 231 is a portion of bulk substrate 205 with isolation dielectric 380 in the form of shallow trenches. FIG. 3B illustrates a cross-sectional view along the A-A' and B-B' lines from FIG. 2 for a non-planar transistor, in accordance with some other embodiments. In this exemplary embodiment, channel crystal 231 is a portion of a fin 303 extending from bulk substrate 205 a fin height $H_1$ above surrounding isolation dielectric 380. Any known technique may be employed to arrive at such a fin structure or other non-planar structure that includes channel crystal 231. As further illustrated in FIG. 3B, a sub-fin 232 is disposed below the channel crystal 231. In some embodiments, sub-fin 232 may have a different material composition than substrate 205, and in further embodiments, channel crystal 231 may have a different material composition than sub-fin 232. For example, where channel crystal 231 is one of GaAs, InP, InAs, InGaAs, AlGaAs, GaP, AlAs, InGaP, sub-fin 232 is another of GaAs, InP, InAs, InGaAs, AlGaAs, GaP, AlAs, InGaP. In other embodiments, sub-fin 232 and fin 231 are the same material, such as, but not limited to, Si.

Returning to FIG. 1, methods 101 continue at operation 115 where a channel region is defined in the channel crystal. In some embodiments, operation 115 entails forming a sacrificial gate stack over a channel region of the channel crystal. Any sacrificial gate stack known to be suitable for a "gate-last" transistor fabrication technique may be employed. Alternatively, in a "gate-first" technique, operation 115 may entail forming the final gate stack over a channel region of the channel crystal. For such embodiments, any gate stack known to be suitable to modulate the conductivity of the channel material may be employed at operation 115. In some advantageous embodiments, the (sacrificial) gate stack formed at operation 115 is deposited over at least a (100) surface of the channel crystal.

Methods 101 continue at operation 125 where a portion of the channel crystal on opposite sides or ends of the channel region defined at operation 115 is at least partially etched. In some advantageous embodiments, operation 125 entails exposing a desired crystal plane or facet of the channel semiconductor that has a lattice constant suitable for seeding a III-N crystal. For exemplary embodiments where the channel crystal comprises silicon and the gate stack is disposed on a (100) surface, the crystal plane exposed at operation 125 is advantageously (111) or (110). Any known crystallographic etch process may be employed at operation 125 as a function of the composition of the channel crystal. In some embodiments where the channel crystal comprises silicon, a TMAH-based or KOH wet etch is employed. In other embodiments, a dry etch or a combination of dry and wet etch processes, crystallographic or isotropic, may be employed at operation 125 to expose a desired plane. Exposure of the target crystal plane at operation 125 may further result in the exposure of one or more other crystal planes.

Figure 4:
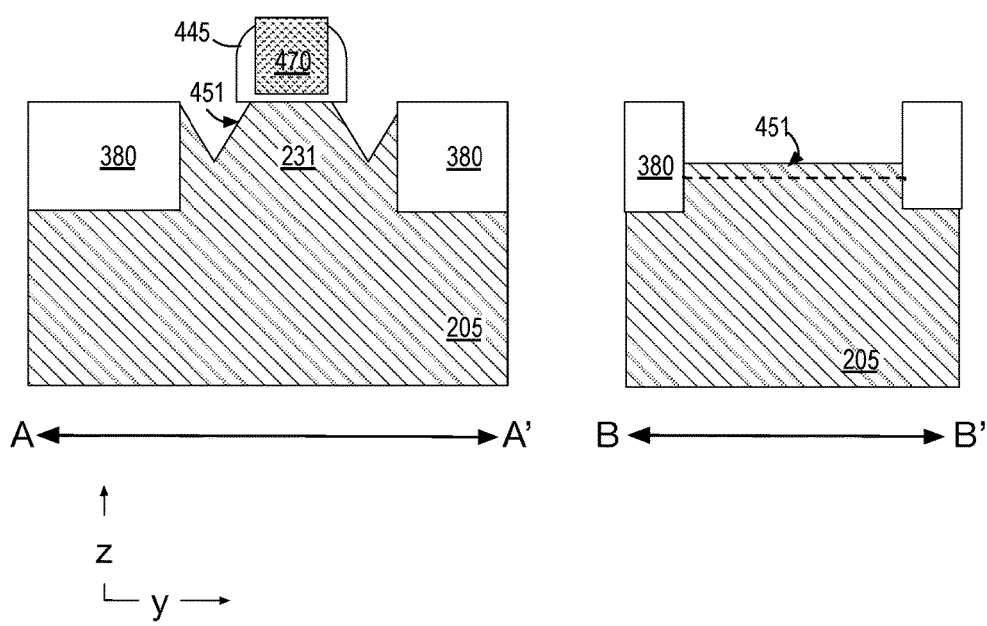
Figure 5A:
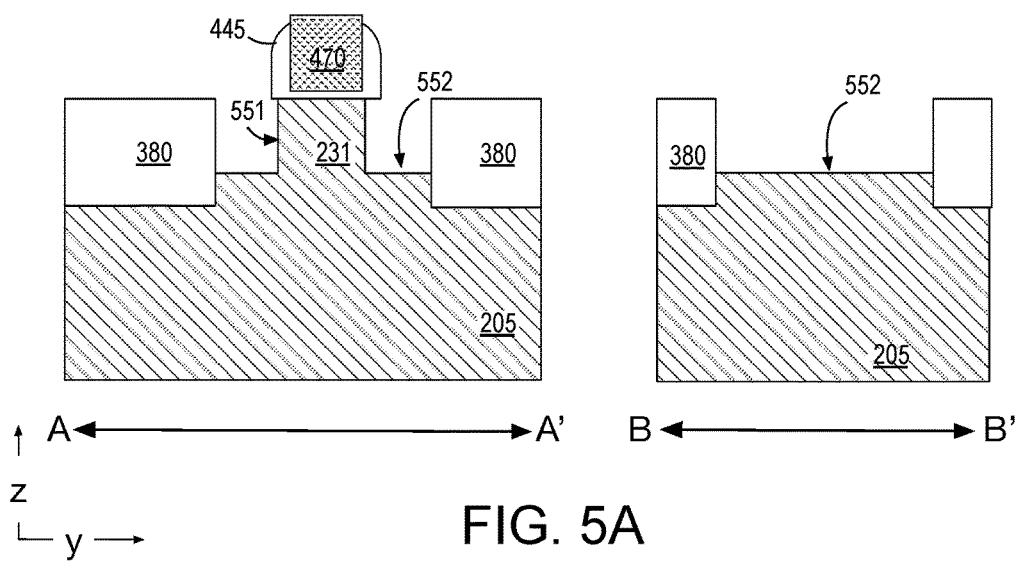
Figure 6A:
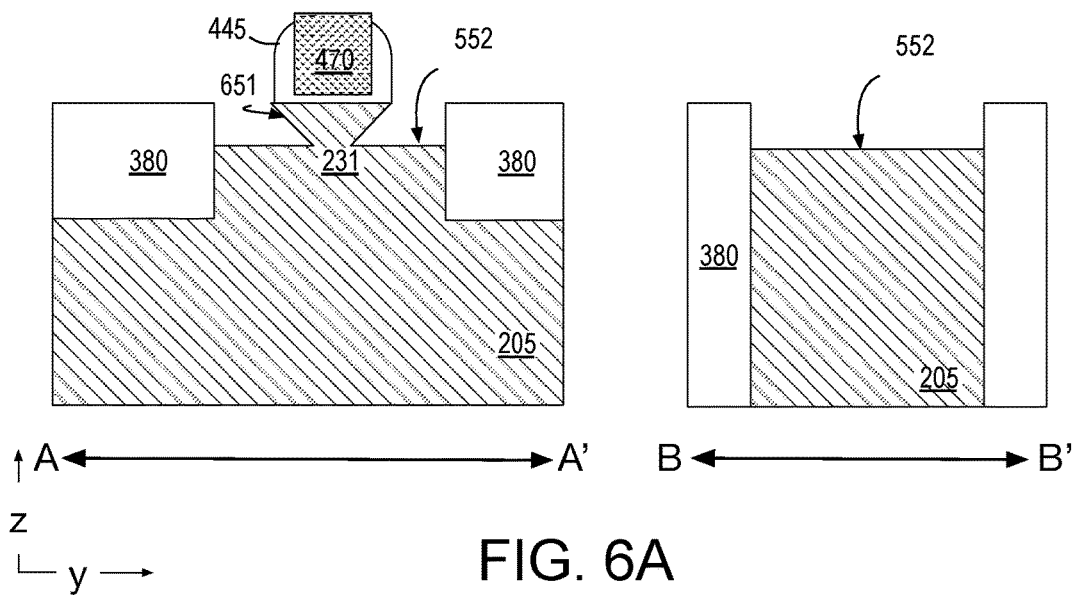

FIGS. 4, 5A, and 6A illustrate cross-sectional views along the A-A' and B-B' lines upon the completion of etching operation 125, in accordance with some exemplary planar transistor embodiments targeting either a (111) or (110) surface for subsequent III-N growth. In FIGS. 4, 5A, and 6A, a lateral spacer 445 is disposed on either side of a sacrificial gate stack that includes a gate mandrel 470. Lateral spacer 445 may be any known dielectric, such as, but not limited to SiO, SiN, SiON, SiCN, etc. Gate mandrel 470 may comprise polysilicon, for example. On either side of the sacrificial gate stack, channel crystal 231 is recessed below a top surface of isolation dielectric 380.

FIG. 4 illustrates one advantageous embodiment where the sacrificial gate stack is disposed on a (100) top surface of channel crystal 231, and recess surface 451 comprises a (111) crystal plane. For such embodiments, channel crystal 231 is etched into a trapezoidal mesa below the channel mask with a top proximal to the channel mask narrower than a bottom. In some further embodiments, at least a portion of lateral spacer 445 (e.g., 3-4 nm) is undercut by the etching process, for example by performing a first etch non-selective to the (111) plane followed by an etch selective to the (111) plane.

FIG. 5A illustrates a cross-sectional view along the A-A' and B-B' lines upon the completion of operation 125, in accordance with some alternative planar transistor embodiments where a (110) crystal plane is targeted as the seeding surface for a III-N source/drain crystal. An anisotropic etch masked by the channel mask may be performed. The anisotropic etch may be based on crystallographic etchant selective to the (110) plane, or simply a directional process. With the sacrificial gate stack in contact with a (100) top surface of channel crystal 231, exposure of a recess sidewall surface 551 comprising a (110) crystal plane also exposes a recess bottom surface 552 comprising a (100) crystal plane.

FIG. 6A illustrates a cross-sectional view along the A-A' and B-B' lines upon the completion of operation 125, in accordance with another alternative planar transistor embodiment where a (111) crystal plane is targeted as the seeding surface for a III-N source/drain crystal. For such embodiments, channel crystal 231 is etched into a trapezoidal mesa with a top wider than a bottom. Such an etch profile may be achieved by combining the etch processes associated with the structures illustrated and FIG. 4 and FIG. 5A. For example, a first anisotropic etch masked by the channel mask may be followed by a crystallographic etchant selective to the (111) plane (e.g., TMAH). In some embodiments where the sacrificial gate electrode is in contact with a (100) top surface of channel crystal 231, exposing recess sidewall surface 651 comprising a (111) crystal plane and also exposes recess bottom surface 552 comprising a (100) crystal plane.

Figure 5B:
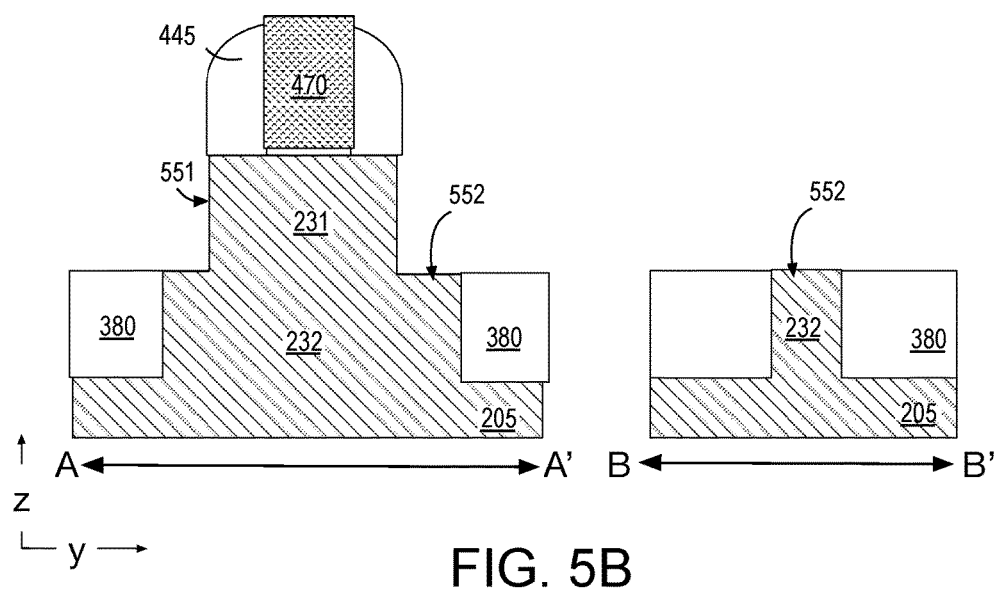
Figure 6B:
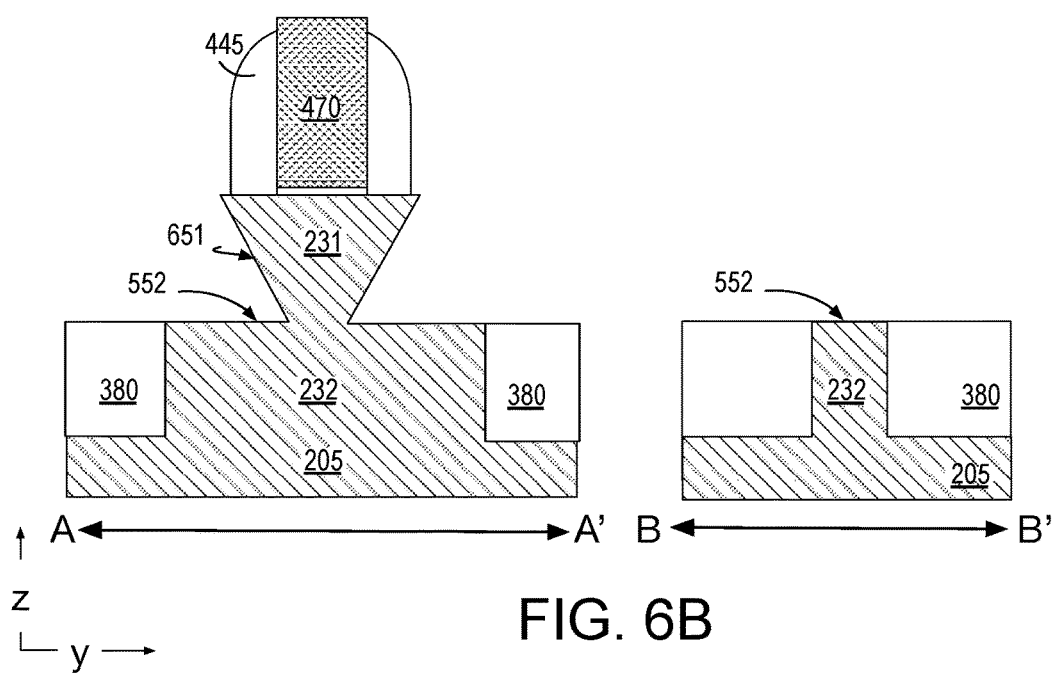
Figure 7A:
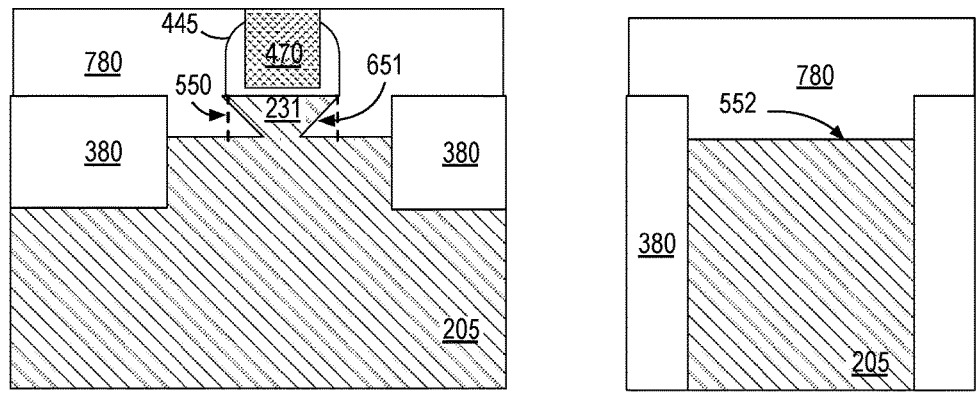
Figure 7B:
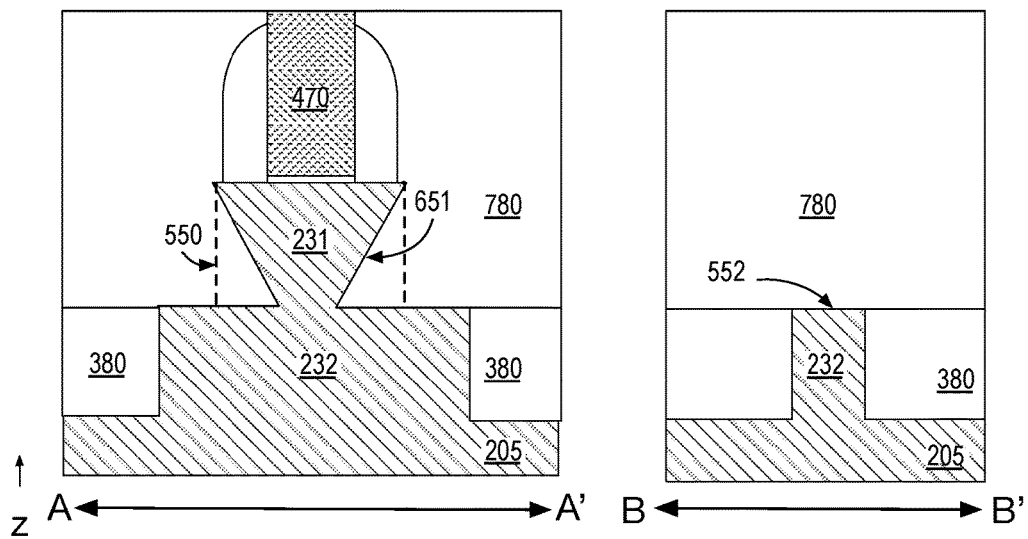

FIGS. 5B and 6B illustrate cross-sectional views along the A-A' and B-B' lines upon the completion of channel etching operation 125, in accordance with some exemplary non-planar transistor embodiments targeting either a (111) or (110) surface for subsequent III-N growth. In FIGS. 5B and 6B, gate mandrel 470 and lateral spacer 445 are disposed over the top surface of channel crystal 231, and also disposed over opposing sidewalls of channel crystal 231.

FIG. 5B illustrates a cross-sectional view along the A-A' and B-B' lines upon the completion of operation 125, in accordance with some embodiments targeting exposure of (110) channel sidewall surface 551. As described above in the context of FIG. 5A, the recess etching operation 125 also exposes a (100) plane at bottom surface 552. FIG. 6B illustrates a cross-sectional view along the A-A' and B-B' lines upon the completion of operation 125, in accordance with some alternative embodiments where a (111) crystal plane is targeted as the seeding surface for a III-N source/drain crystal. Similar to the planar structure illustrated in FIG. 6A, channel crystal 231 is etched into a trapezoidal mesa with a top wider than a bottom. Because of the fin structure, a crystallographic etchant selective to the (111) plane (e.g., TMAH) arrives at this undercut profile. For such embodiments where the sacrificial gate stack is in contact with a (100) top surface of channel crystal 231, exposing recess sidewall surface 651 comprising a (111) crystal plane also entails exposing recess bottom surface 552 that comprising a (100) crystal plane. For embodiments where a fin includes both channel crystal 231 and a sub-fin 232, bottom surface 552 may be a crystal plane of the sub-fin crystal 232.

Returning to FIG. 1, methods 101 continue at operation 135 where an amorphous material is applied to any surfaces of the channel crystal other than the plane(s) from which the III-N source/drain crystals are to be grown. For example, where a (111) facet is targeted as the seeding surface to be employed in during a subsequent III-N source/drain crystal growth, an amorphous material of any suitable composition is deposited over any plane other than the (111) plane to avoid competitive growth fronts. Operation 135 may be skipped for embodiments where all the surfaces generated during the recess etching operation 125 are suitable for single crystalline III-N growths. For example, no further masking is needed for the embodiment illustrated in FIG. 4. For the embodiments illustrated in FIGS. 5A, 5B and 6A, 6B however, the (100) plane at recess bottom surface 552 is masked at operation 135 because single-crystalline III-N growth on Si (100) is significantly more challenging due to the much larger lattice mismatch (e.g., ~41% mismatch for GaN). Furthermore, domain formation is difficult to control if multiple intersecting crystal facets are presented during III-N source/drain growth.

Figure 8A:
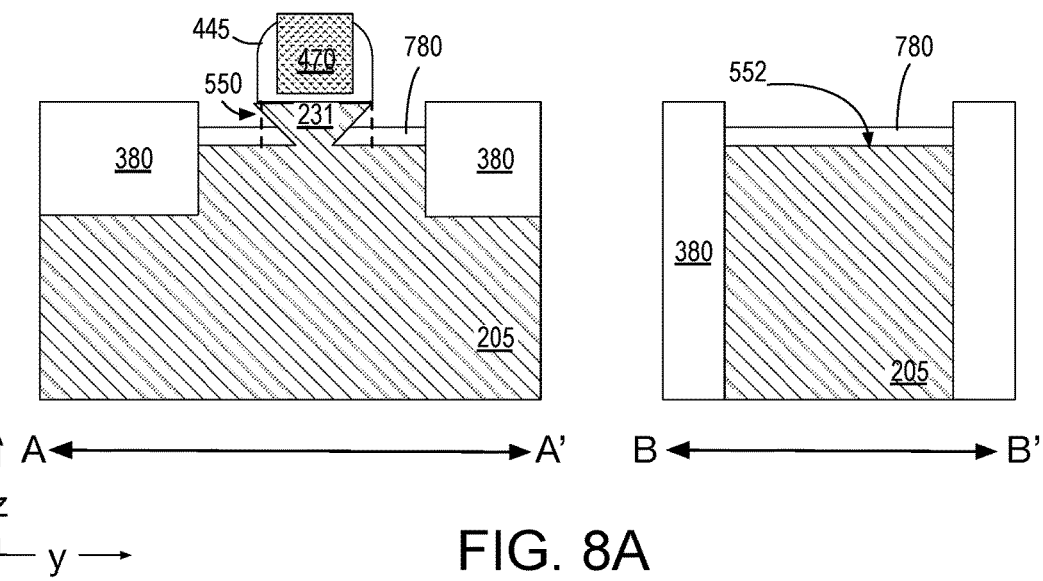
Figure 8B:
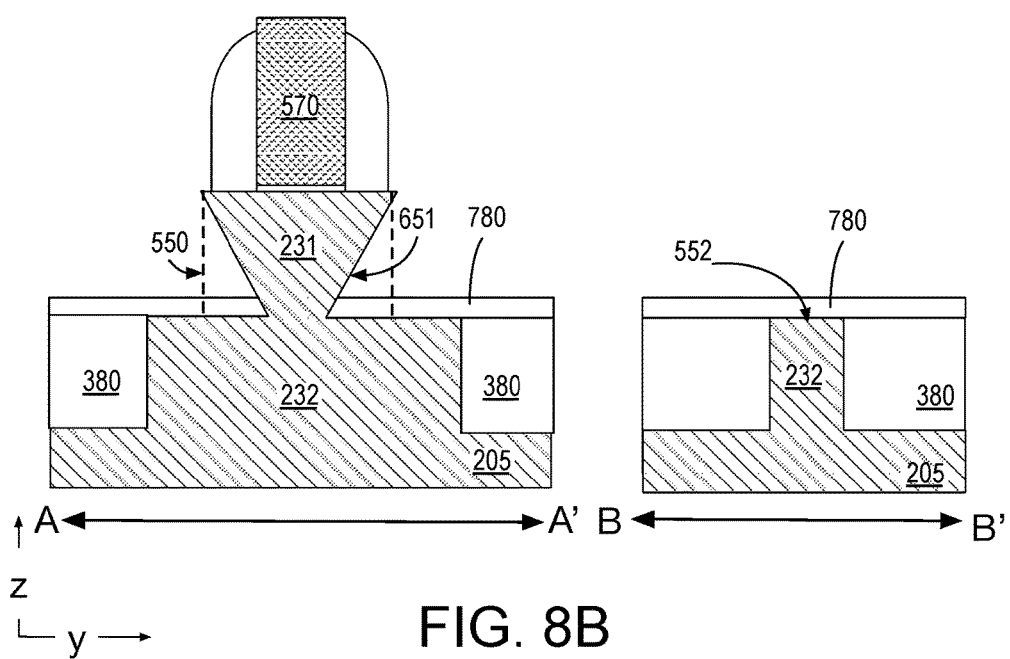

In some embodiments, operation 135 entails depositing an amorphous dielectric material such as, but not limited to, alumina ($Al_2O_3$), silica (SiO), carbon-doped silica (SiOC), carbon-doped silicon (SiC), silicon nitrides (SiN), silicon oxynitrides (SiON), silicon carbonitrides (SiCN), or silicon-based polymer dielectrics (e.g., HSQ, or MSQ). The amorphous material deposited at operation 135 may be planarized with at top surface of the (sacrificial) gate stack. As further illustrated in FIG. 7A for exemplary planar transistor embodiments, or in FIG. 7B for exemplary non-planar transistor embodiments, a top surface of amorphous material 780 is planarized with a top surface of gate mandrel 470, for example with any known chemical-mechanical polishing (CMP) process. Amorphous material 780 backfills the etch recess covering bottom surface 552 and sidewall surfaces 550 or 651. The planarized amorphous material may then be recessed etched to re-expose at least a portion of the surface facets targeted for seeding the III-N growth. Any etch process selective to amorphous material 780 over the (sacrificial) gate stack and lateral spacers 445 may be employed to thin the amorphous material. As illustrated in FIGS. 8A and 8B, amorphous material 780 is recessed etched to expose sidewall surface 550 or 651 without exposing bottom surface 552.

Returning to FIG. 1, methods 101 continue at operation 145 where a III-N source/drain crystal is grown on the targeted channel crystal facet (e.g., either (111) or (110) planes for the exemplary cubic or zinc blende embodiments). Epitaxial growth of III-N source/drain crystals may utilize any known techniques, such as, but not limited to metal-organic chemical vapor deposition (MOCVD), or molecular beam epitaxy (MBE). In some embodiments, elevated temperatures of 1050 C, or more, are employed at operation 145 to epitaxially grow pseudomorphic III-N source/drain crystal. In-situ doping may be employed during growth operation 145 to achieve as high impurity dopant concentration as possible for lowest contact resistance. In some advantageous NMOS embodiments, a source of an n-type impurity dopant species, such as a silicon, is introduced during III-N growth operation 145. III-N crystals can be highly doped n-type, and in advantageous embodiments the III-N source/drain crystals grown at operation 145 include at least $1\times10^{20}$ impurity atoms/cm$^3$.

One or more III-N alloy composition may be grown at operation 145. In some advantageous embodiments, the heteroepitaxial growth at operation 145 is initiated with a nucleation step where a discontinuous film, such as AlN, is formed on the seeding surface of the channel crystal. Besides acting as a nucleation layer, AlN can reduce or avoid meltback etching of Si and Ga at high temperatures. If a nucleation layer is employed, it advantageously very thin (e.g., 1-2 nm) to avoid introducing a band gap offset with the channel crystal that would significantly impede carrier conduction. For low temperature growths (e.g., <800° C.) an AlN layer may be avoided. In some advantageous embodiments, n-type doped InGaN is grown <800° C. without an AlN layer. The inclusion of In facilitates low resistance ohmic contact with subsequently formed contact metallization. The amount of In may be selected to provide favorable band gap alignment with the channel crystal. For example, where the channel crystal is silicon, the group III constituent may be approximately (40-45% In) to align the conduction band of the silicon channel crystal with the conduction band of the InGaN source/drain crystal.

Figure 9A:
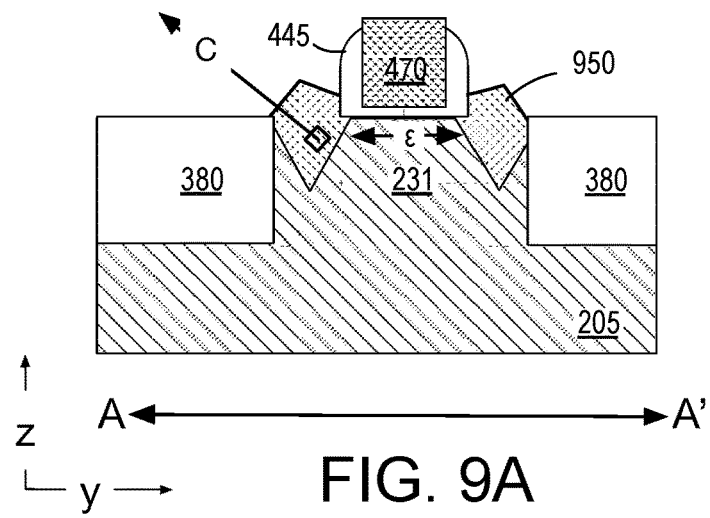
FIGS. 9A, 9B, and 9C are cross-sectional views of planar transistor structures with heteroepitaxial III-N source and drain crystals, in accordance with some embodiments.
Figure 9B:
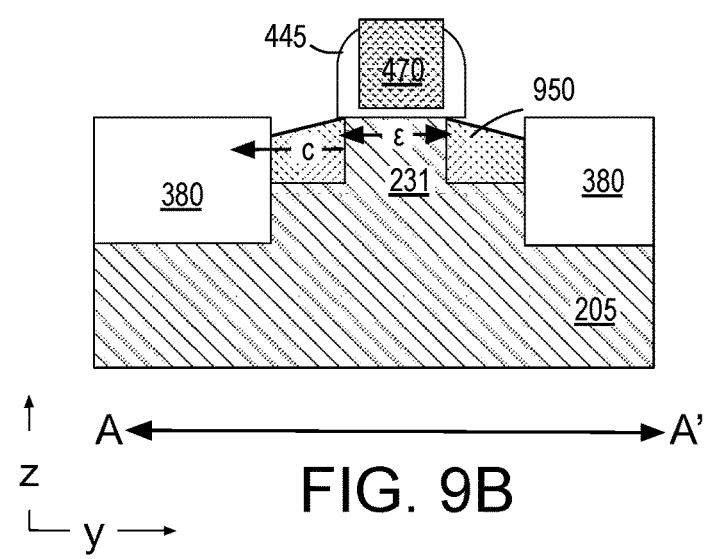
Figure 9C:
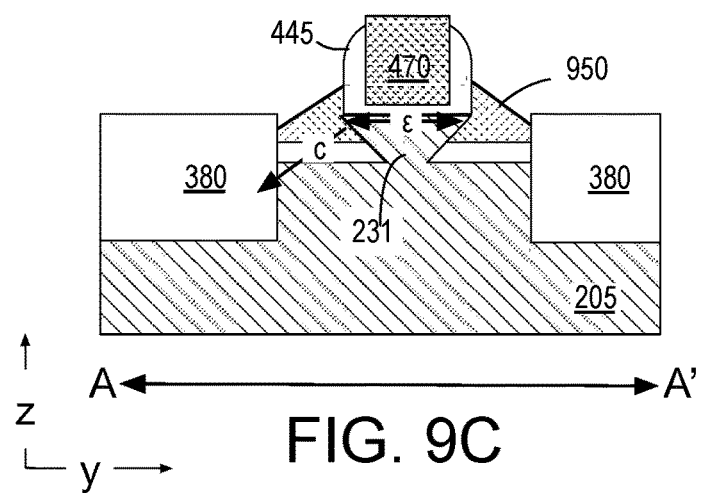
Figure 9D:
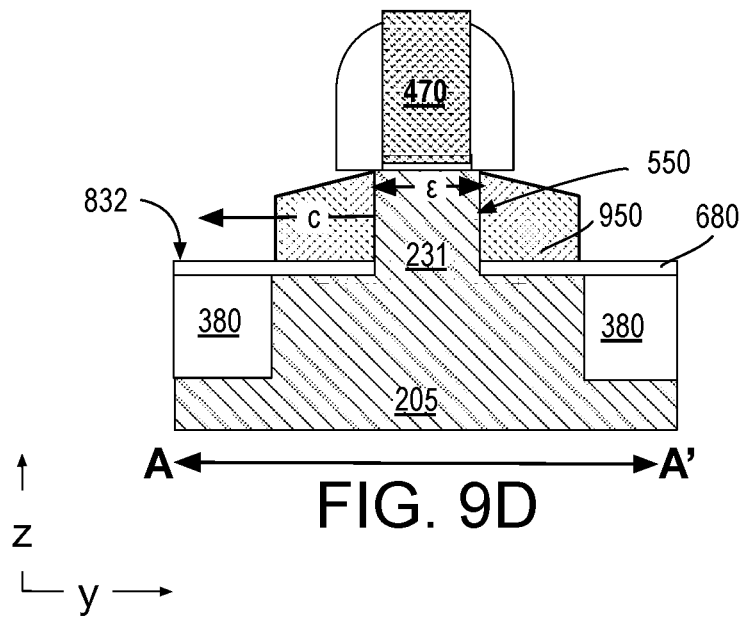
FIGS. 9D and 9E are cross-sectional views of non-planar transistor structures with heteroepitaxial III-N source and drain crystals, in accordance with some embodiments.
Figure 9E:
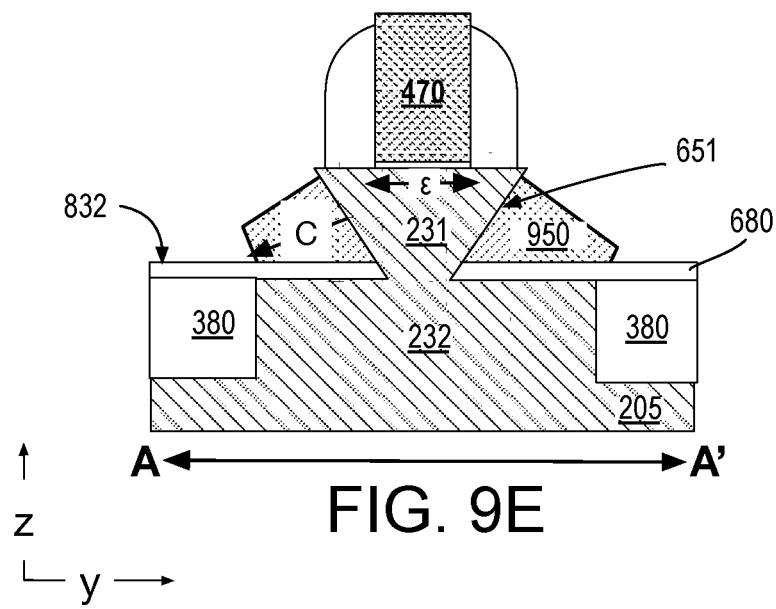

In some embodiments, the III-N source/drain crystal is grown in the hexagonal form with the c-axis extending substantially orthogonal from the seeding surface of the channel crystal. For example, the c-axis is substantially aligned with the <111> direction of the channel crystal for embodiments where the seeding surface is a (111) facet, or the c-axis is substantially aligned with the <110> direction of the channel crystal for embodiments where the seeding surface is a (110) facet. In this context, "substantially" aligned means the c-axis may up to 5° less than normal from the seeding surface facet. FIG. 9A-9C illustrate cross-sectional views of a doped III-N source/drain crystal 950 disposed on the exemplary (111) and (110) seeding surfaces introduced above, in accordance with some planar transistor embodiments. FIG. 9D-9E illustrate cross-sectional views of doped III-N source/drain crystal 950 disposed on these same seeding surfaces, in accordance with some non-planar transistor embodiments. In some embodiments, the {000-1} plane of III-N source/drain crystal 950 is proximal to channel crystal 231 (Ga polarity), though growths of N polarity are also suitable for source/drain crystal 950.

Depending on the orientation of the seeding surface, vertical III-N growth or lateral epitaxial overgrowth conditions may be engineered to favor advancing a growth face of a III-N crystal over adjacent amorphous material to the extent possible for a given transistor pitch (e.g., contact poly pitch, or CPP). Maximizing the dimensions of the III-N source/drain crystal may advantageously increase the stress in the source/drain crystal, thereby increasing lateral strain in the channel crystal. From the orientation of the c-axes illustrated in FIG. 9A-9E, it can be seen that III-N growth conditions to favor either higher c-axis growth rates or higher c-plane growth rates is a function of the particular transistor architecture. In some embodiments therefore, the III-N growth operation may entail epitaxial growth conditions (e.g., a first III-N growth pressure, a first III-N growth temperature, and a first V/III growth precursor ratio) that favor either higher c-axis or c-plane growth rates. The III-N growth operation may further entail multiple growth conditions. For example, following an initial growth period at first growth conditions favoring c-axis growth, the growth conditions may be changed to favor lateral epitaxial overgrowth (LEO) of the doped III-N source/drain crystals to best fill the recess formed at operation 125. In some embodiments, the epitaxial III-N source/drain crystal remains monocrystalline as it advances over amorphous material 680 (FIGS. 9B, 9C and 9E). Amorphous material 680 then becomes disposed between III-N source/drain crystal 950 and a (100) surface of a group IV or group III-V semiconductor.

Crystal quality of III-N source/drain crystal 950 may vary as a function of the III-N material composition (e.g., Al, In, Ga, %), properties of the seeding surface, and III-N growth conditions. The application of strain to channel crystal 231 is dependent on the amount of stress that can be maintained within III-N source/drain crystal 950 in the pseudomorphic form. For a given III-N composition, crystals of better quality will be under greater stress. The inventors have achieved excellent GaN crystal quality for both (111) and (110) silicon surfaces. The addition of In reduces lattice mismatch, further improving crystal quality in advantageous InGaN (e.g., $In_{0.4}Ga_{0.6}N$) embodiments. In some embodiments therefore, source/drain crystal 950 has a dislocation density in the range of $10^8$-$10^{11}$/cm². Accordingly, high levels of tensile stress may be achieved within III-N source/drain crystal 950, which induces lateral tensile strain ε under the (sacrificial) gate stack illustrated in FIG. 9A-9F. Notably, there will be a tensile component into the plane of the page (e.g., x-dimension) for these structures. With planes 651, 552 being compressed which forces other planes to elongate (be under tensile strain) since the volume of channel crystal 231 is confined from all directions. This tensile strain then enhances the channel crystal's carrier conductance.

Figure 10A:
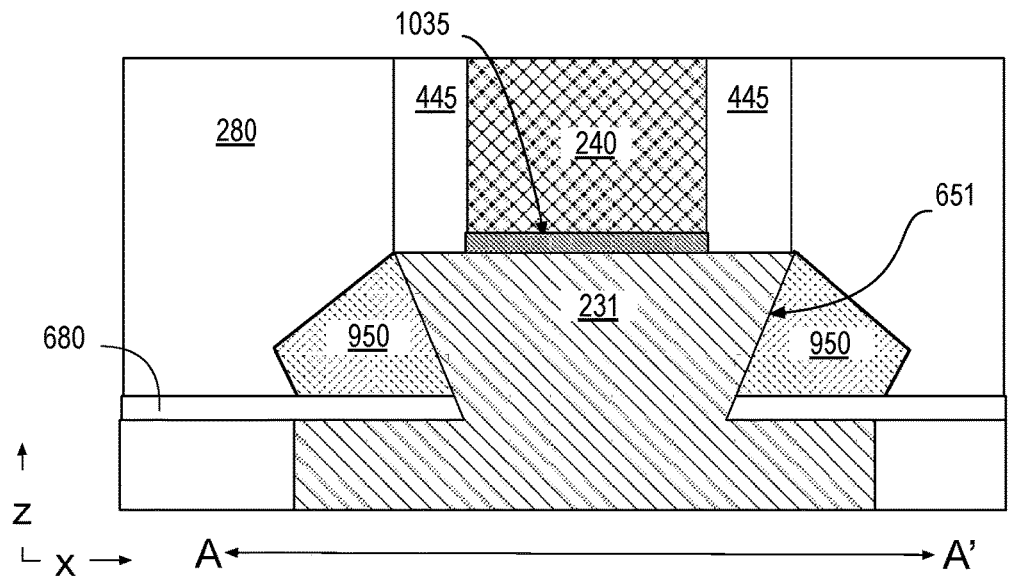
FIGS. 10A and 10B are cross-sectional views of non-planar transistor structures with heteroepitaxial III-N source and drain crystals as selected operations in the method illustrated in FIG. 1 are performed, in accordance with some embodiments.
Figure 10B:
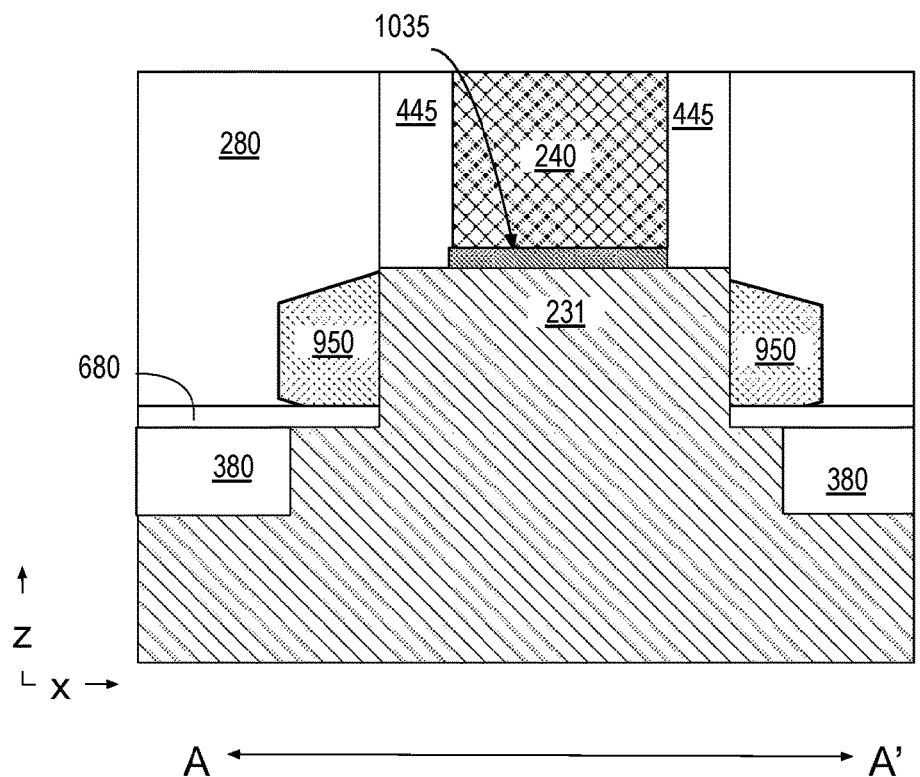

Returning to FIG. 1, methods 101 are completed with the formation of the transistor terminals at operation 155. In some exemplary embodiments, formation of the gate terminal entails replacing a sacrificial gate stack with a permanent gate stack having properties suitable for the channel crystal. FIG. 10A-10B are cross-sectional views illustrating gate replacement for exemplary non-planar transistor embodiments. Similar structures may be fabricated for planar transistor embodiments using known techniques. In the illustrated examples, ILD 280 is deposited over III-N source/drain crystal 950 and planarized with a top surface of the sacrificial gate stack. The sacrificial gate stack is then replaced with a gate dielectric 1035 and gate electrode 240. Gate electrode 240 may be any metal or semiconductor known to have suitable conductivity and work function difference for channel crystal 231. Gate dielectric 1035 may be any high-k (e.g., $HfO_2$, $Al_2O_3$, etc.) and/or conventional (e.g., $SiO_2$) dielectric material known to be suitable for the group IV or group III-V channel crystal. Any known dielectric deposition process, such as CVD and ALD may be utilized to form gate dielectric 1035. Any known metal deposition process, such as CVD, ALD, and/or PVD may be utilized to form the gate electrode 240.

Figure 11A:
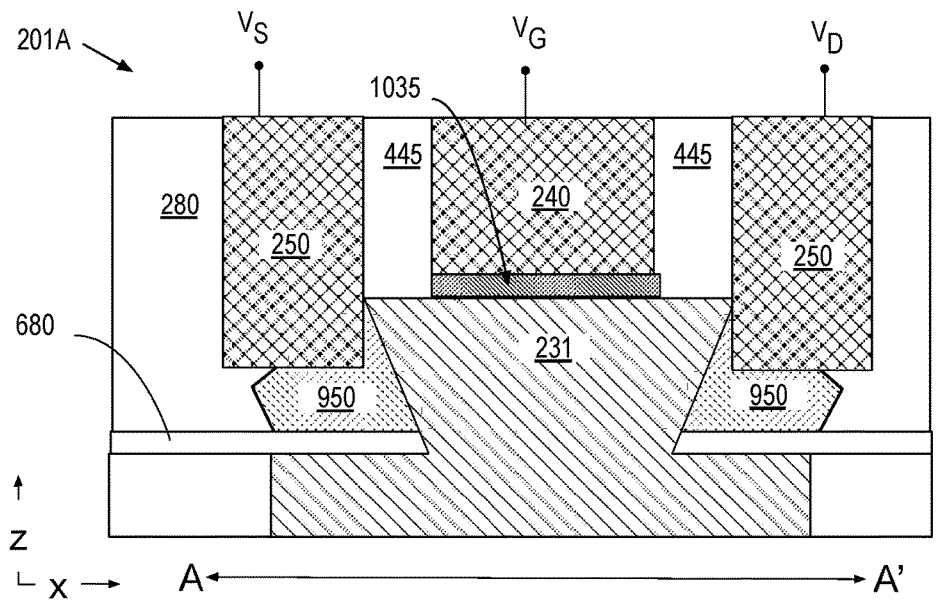
FIGS. 11A and 11B are cross-sectional views of non-planar transistor structures with heteroepitaxial III-N source and drain crystals, in accordance with some embodiments.
Figure 11B:
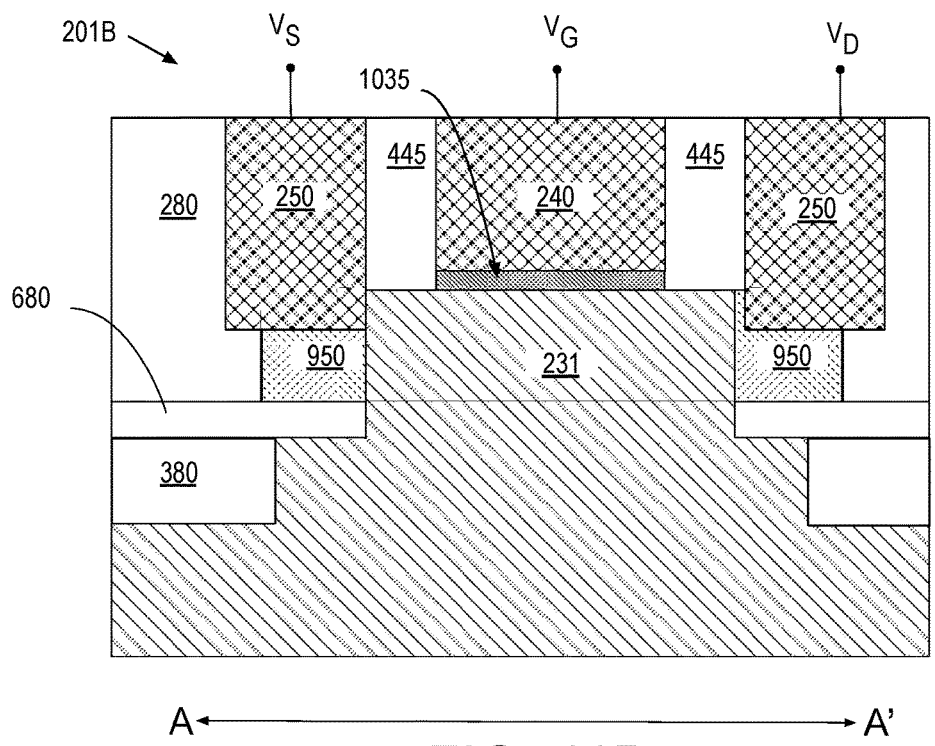

FIG. 11A-11B are cross-sectional views illustrating exemplary group IV or III-V finFETs 201A-201B, in accordance with some embodiments. FinFETs 201A-201B are further illustrated with source/drain contact metallization 250. In the illustrated examples, contact metallization 250 extends down through interlayer dielectric 280 and lands on (n+) doped III-N source/drain crystals 950. A top surface of contact metallization 250 is substantially planar with gate electrode 240. Similar structures may be fabricated for planar transistor embodiments using known techniques. Any known backend metallization process may be employed to interconnect transistor 201A, 201B with other transistors and/or passive devices to form an IC.

Figure 12:
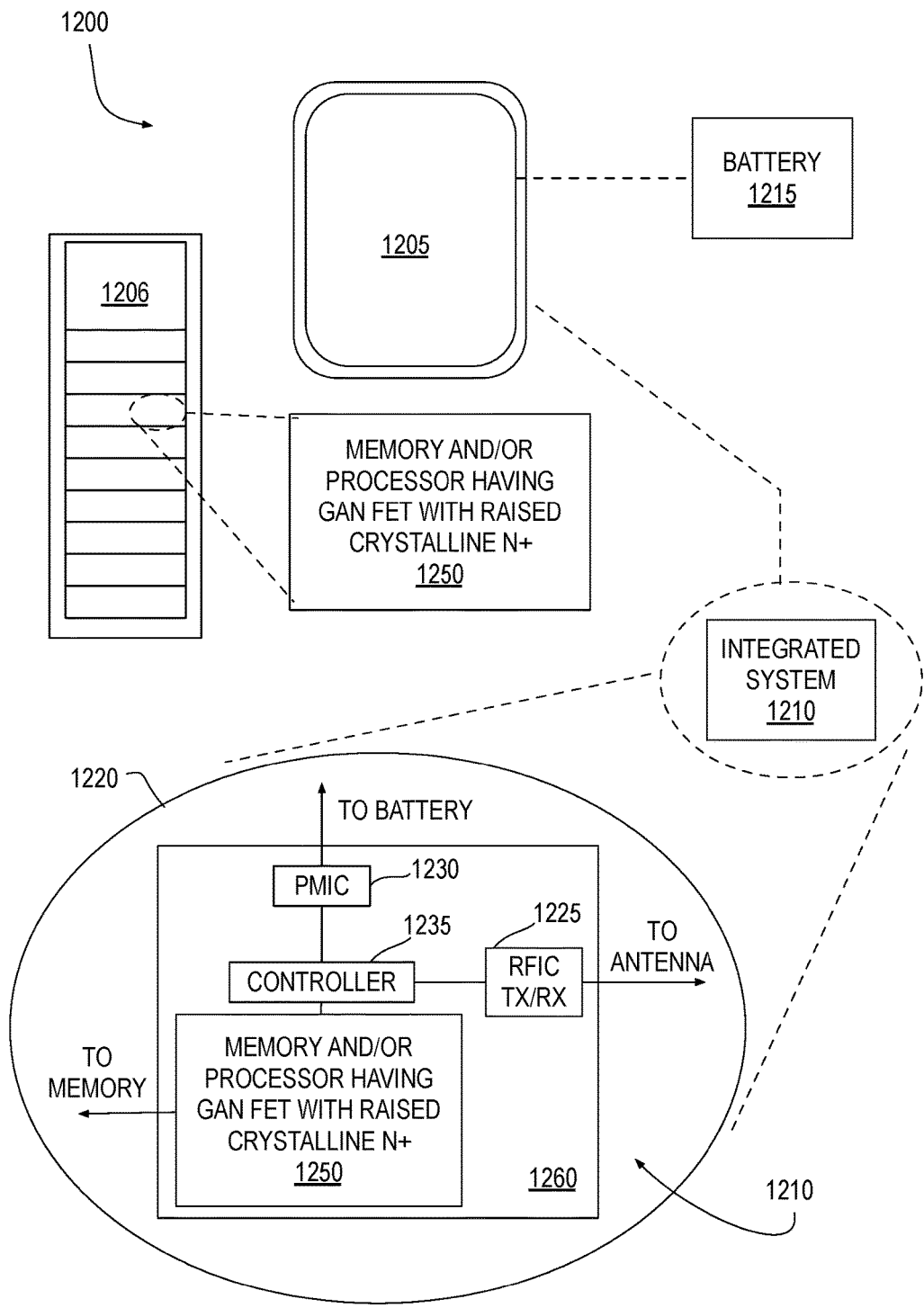
FIG. 12 illustrates a mobile computing platform and a data server machine employing an SoC including finFETs with III-N source/drain crystals, in accordance with embodiments.

FIG. 12 illustrates a system 1200 in which a mobile computing platform 1205 and/or a data server machine 1206 employs an IC including at least one group IV or III-V finFET, planar, or nanowire transistor including heteroepitaxial III-N source/drains, in accordance with some embodiments. In some such embodiments, a CMOS IC includes both nMOS and pMOS transistors. In some embodiments, the nMOS transistor further includes a first group IV or group III-V semiconductor channel crystal disposed over a substrate and associated with a first lattice constant. The nMOS transistor further includes a first gate stack disposed over the first channel crystal. The nMOS transistor further includes a doped III-N source and drain crystal disposed in contact with ends of the first channel crystal on opposite sides of the gate stack, the source and drain crystals associated with a lattice constant smaller than the first lattice constant. In some embodiments, the pMOS transistor further includes a second group IV or group III-V semiconductor channel crystal disposed over a substrate and associated with a second lattice constant. The second channel crystal may be of a same or different composition than the first channel crystal (e.g., first lattice constant equal to the second lattice constant). The pMOS transistor further includes a second gate stack disposed over the second channel crystal. The pMOS transistor further includes a doped group IV or group III-V source and drain crystal disposed in contact with ends of the second channel crystal on opposite sides of the gate stack. These source and drain crystals are associated with a lattice constant no smaller than the second lattice constant, allowing for the pMOS channel to be either unstrained, or compressively strained while the nMOS transistor is tensilely strained.

The server machine 1206 may be any commercial server, for example including any number of high-performance computing platforms disposed within a rack and networked together for electronic data processing, which in the exemplary embodiment includes a packaged monolithic IC 1250. The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen), a chip-level or package-level integrated system 1210, and a battery 1215.

Whether disposed within the integrated system 1210 illustrated in the expanded view 1220, or as a stand-alone packaged chip within the server machine 1206, packaged monolithic IC 1250 includes a memory chip (e.g., RAM), or a processor chip (e.g., a microprocessor, a multi-core microprocessor, graphics processor, or the like) including at least one group IV or III-V finFET planar, or nanowire transistor including heteroepitaxial III-N source/drains, for example as describe elsewhere herein. The monolithic IC 1250 may be further coupled to a board, a substrate, or an interposer 1260 along with, one or more of a power management integrated circuit (PMIC) 1230, RF (wireless) integrated circuit (RFIC) 1225 including a wideband RF (wireless) transmitter and/or receiver (TX/RX) (e.g., including a digital baseband and an analog front end module further comprises a power amplifier on a transmit path and a low noise amplifier on a receive path), and a controller thereof 1235.

Functionally, PMIC 1230 may perform battery power regulation, DC-to-DC conversion, etc., and so has an input coupled to battery 1215 and with an output providing a current supply to other functional modules. As further illustrated, in the exemplary embodiment, RFIC 1225 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1250 or within a single IC coupled to the package substrate of the monolithic IC 1250.

Figure 13:
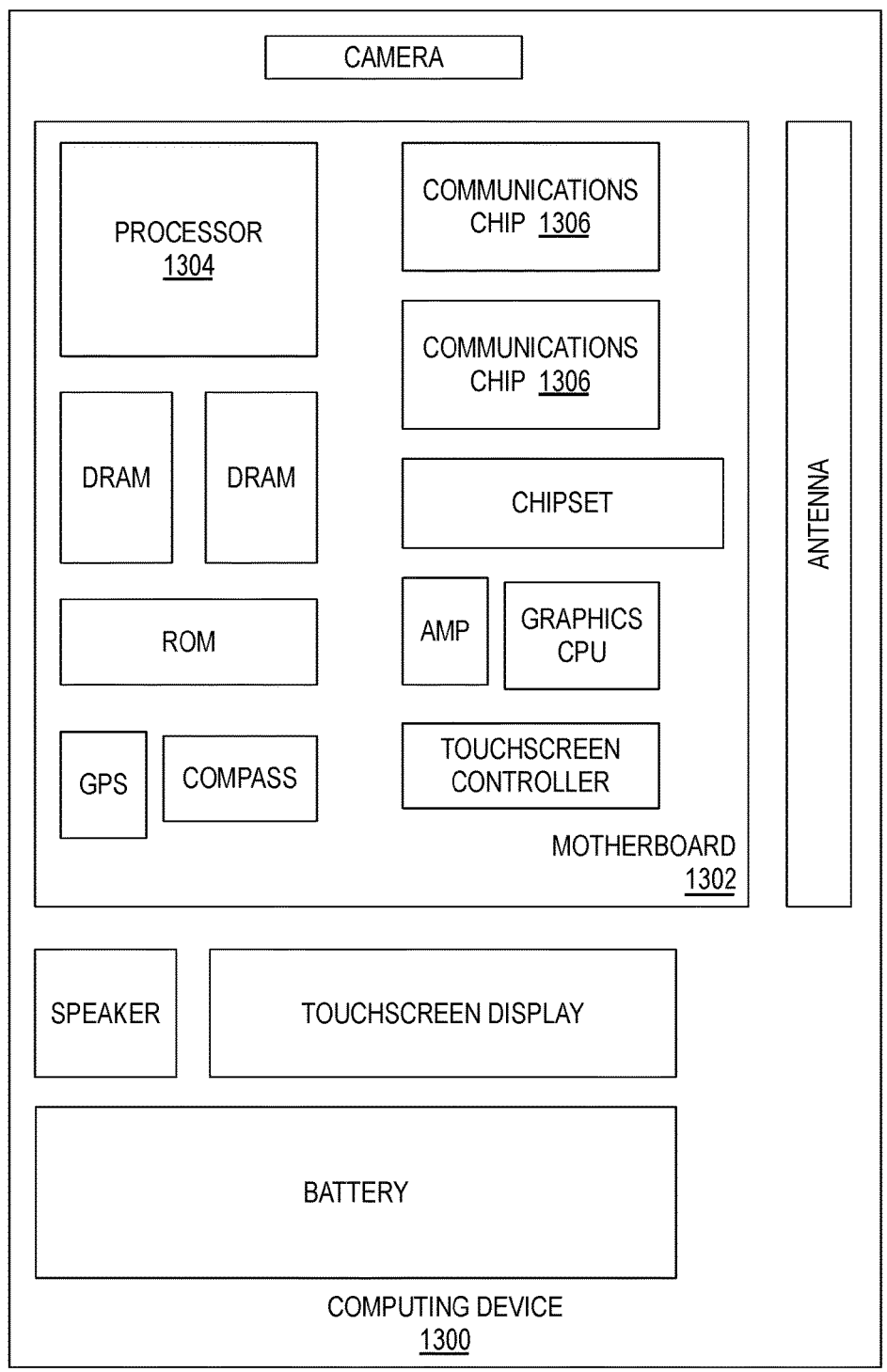
FIG. 13 is a functional block diagram of an electronic computing device, in accordance with some embodiments.

FIG. 13 is a functional block diagram of a computing device 1300, arranged in accordance with at least some implementations of the present disclosure. Computing device 1300 may be found inside platform 1205 or server machine 1206, for example. Device 1300 further includes a motherboard 1302 hosting a number of components, such as, but not limited to, a processor 1304 (e.g., an applications processor), which may further incorporate at least one finFET including a heteroepitaxial III-N source/drain, in accordance with some embodiments. Processor 1304 may be physically and/or electrically coupled to motherboard 1302. In some examples, processor 1304 includes an integrated circuit die packaged within the processor 1304. In general, the term "processor" or "microprocessor" may refer to any device or portion of a device that processes electronic data from registers and/or memory to transform that electronic data into other electronic data that may be further stored in registers and/or memory.

In various examples, one or more communication chips 1306 may also be physically and/or electrically coupled to the motherboard 1302. In further implementations, communication chips 1306 may be part of processor 1304. Depending on its applications, computing device 1300 may include other components that may or may not be physically and electrically coupled to motherboard 1302. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including but not limited to those described elsewhere herein. As discussed, computing device 1300 may include a plurality of communication chips 1306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that embodiments other than those described in detail above may be practiced with modification and alteration without departing from the scope of the appended claims. For example the above embodiments may include specific combinations of features as further provided below:

In one or more first embodiments, a transistor, comprises a group IV or group III-V semiconductor channel crystal disposed over a substrate and associated with a first lattice constant, a gate stack disposed over the channel crystal, a doped III-N source crystal disposed in contact with a first end of the channel crystal on a first side of the gate stack, the source crystal associated with a lattice constant smaller than the first lattice constant, a doped III-N drain crystal disposed in contact with a second end of the channel crystal on a second side of the gate stack, the drain crystal associated with a lattice constant smaller than the first lattice constant, and source and drain contact metallization in contact with the source and drain crystals.

In furtherance of the first embodiments, the channel semiconductor crystal comprises group IV lattice atoms, the gate stack is disposed over a (100) surface of the channel crystal, and the source and drain crystals are hexagonal with a c-axis extending substantially orthogonally from a faceted surface of the channel crystal, the faceted surface being other than a (100) surface.

In furtherance of the first embodiments immediately above, the source and drain crystals each have a c-axis extending substantially orthogonally from a (111) faceted surface of the channel crystal.

In furtherance of the first embodiments immediately above, the source and drain crystals each have a c-axis extending substantially orthogonally from a (110) faceted surface of the channel crystal.

In furtherance of the first embodiments, an amorphous material is disposed over the substrate and adjacent to the channel crystal, the amorphous material disposed on crystal plane of a group IV or group III-V semiconductor surface different from the crystal plane of the channel crystal in contact with the III-N source and drain crystals.

In furtherance of the first embodiments immediately above, the amorphous material is in contact with a portion of the faceted surface of the channel crystal and further disposed between the source and drain crystals and an underlying (100) surface of a group IV or group III-V semiconductor.

In furtherance of the first embodiments, the transistor comprises a fin extending from the substrate, the fin including the channel crystal disposed over a sub-fin, the amorphous material is disposed over a (100) surface of the sub-fin, and the source and drain crystals are disposed over the amorphous material.

In furtherance of the first embodiments, the channel crystal comprises Si, and the source and drain crystals are both doped n-type and comprise InGaN.

In furtherance of the first embodiments immediately above, the III-N source and drain crystals are doped with Si to at least $1 \times 10^{20}$ atoms/cm$^3$, and the InGaN comprises no more than 40% In.

In furtherance of the first embodiments, the doped III-N crystal has a dislocation density no more than $10^{11}$ cm$^{-2}$, and the gate stack comprises a metal gate electrode disposed on a high-k gate dielectric.

In one or more second embodiments, a CMOS IC includes an nMOS transistor further including a first group IV or group III-V semiconductor channel crystal disposed over a substrate and associated with a first lattice constant, a first gate stack disposed over the first channel crystal, a doped III-N source and drain crystal disposed in contact with ends of the first channel crystal on opposite sides of the gate stack, the source and drain crystals associated with a lattice constant smaller than the first lattice constant. The CMOS IC further includes a pMOS transistor further including a second group IV or group III-V semiconductor channel crystal disposed over a substrate and associated with a second lattice constant, a second gate stack disposed over the second channel crystal, and a doped group IV or group III-V source and drain crystal disposed in contact with ends of the second channel crystal on opposite sides of the gate stack, the source and drain crystals associated with a lattice constant no smaller than the second lattice constant.

In furtherance of the second embodiments, the first and second channel crystals both comprise group IV lattice atoms. The first and second gate stacks are disposed over a (100) surface of the channel crystals. The III-N source and drain crystals are hexagonal with a c-axis extending substantially orthogonally from a faceted surface of the first channel crystal, the faceted surface being other than a (100) surface.

In one or more third embodiments, a method of forming semiconductor device comprises forming a gate stack over a (100) surface of a group IV or group III-V semiconductor channel crystal associated with a first lattice constant, heteroepitaxially growing a doped III-N source crystal on a first surface of the channel crystal on a first side of the gate stack, the III-N source crystal associated with a lattice constant smaller than the first lattice constant and with a c-axis extending substantially orthogonally from the first surface, and the first surface being other than a (100) surface, and heteroepitaxially growing a doped III-N drain crystal on a second surface of the channel crystal on a second side of the gate stack, the III-N drain crystal associated with a lattice constant smaller than the first lattice constant and with a c-axis extending substantially orthogonally from the second surface, and the second surface being other than a (100) surface.

In furtherance of the third embodiments, the method further comprises performing a crystallographic etch of the channel crystal to expose a (111) or (110) facet on the first and second surfaces, and heteroepitaxially growing the source and drain crystals from the exposed (111) or (110) facets.

In furtherance of the third embodiments immediately above, performing the crystallographic etch of the channel crystal further comprises exposing a (100) surface adjacent to the channel crystal, and the method further comprises depositing an amorphous material over the (100) surface adjacent to the channel crystal before heteroepitaxially growing the source and drain crystals.

In furtherance of the third embodiments immediately above, the gate stack is formed on at least a (100) silicon surface of the channel, and heteroepitaxially growing the source and drain crystals further comprises growing III-N material laterally over the amorphous material.

In furtherance of the third embodiments, the channel semiconductor crystal comprises group IV lattice atoms, and heteroepitaxially growing the source and drain crystals further comprises growing silicon-doped In$_x$Ga$_{1-x}$N.

In furtherance of the third embodiments immediately above, the silicon doping is at least $1 \times 10^{20}$ atoms/cm$^3$, and x is not more than 0.4.

In furtherance of the third embodiments, the method further comprises forming the channel crystal into a fin extending from the surface of a substrate, a top surface of the fin being a (100) silicon surface, and performing a crystallographic etch of the channel crystal to expose a (111) or (110) facet on the first and second surfaces; and heteroepitaxially growing the source and drain crystals from the exposed (111) or (110) facets.

In furtherance of the third embodiments, forming the gate stack further comprises forming a sacrificial gate stack prior to forming the source and drain crystals, and replacing the sacrificial gate stack with a permanent gate stack after forming the source and drain crystals.

In furtherance of the third embodiments, heteroepitaxially growing the doped III-N source and drain crystals further comprises growing an AlIn nucleation layer on the first and second surfaces.

In furtherance of the third embodiments, the method further comprises forming source/drain contact metallization to the III-N source/drain crystals.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor, comprising:
    a first crystal over a substrate, wherein the first crystal comprises a group IV or group III-V lattice atom, and is associated with a first lattice constant;
    a gate stack over the first crystal;
    a second crystal proximal to a first end of the first crystal on a first side of the gate stack, wherein the second crystal has hexagonal crystallinity and is associated with a lattice constant that is smaller than the first lattice constant; and
    a third crystal proximal to a second end of the first crystal on a second side of the gate stack, wherein the third crystal has hexagonal crystallinity and is associated with a lattice constant that is smaller than the first lattice constant.

2. The transistor of claim 1, wherein:
    the first crystal comprises group IV lattice atoms;
    the gate stack is over a (100) surface of the first crystal; and
    the second and third crystals comprise nitrogen and group III lattice atoms, and a c-axis extends substantially orthogonally from a facet of the first crystal, the facet being other than a (100) surface of the first crystal.

3. The transistor of claim 2, wherein:
    the second and third crystals each have a c-axis extending substantially orthogonally from a (111) facet of the first crystal.

4. The transistor of claim 3, wherein:
    the second and third crystals each have the c-axis extending substantially orthogonally from a (110) facet of the channel crystal.

5. The transistor of claim 1, wherein an amorphous material is over the substrate and is adjacent to the first crystal, wherein the amorphous material is in contact with a first plane of the first crystal that is different from a second plane of the first crystal that is in contact with at least one of the second and third crystals.

6. The transistor of claim 5, wherein the amorphous material is in contact with a portion of the first plane, and wherein the amorphous material is between an underlying (100) surface of a group IV or group III-V semiconductor and at least one of the second and third crystals.

7. The transistor of claim 5, wherein:
    the transistor comprises a fin extending from the substrate, the fin including the first crystal disposed over a sub-fin;
    the amorphous material is over a (100) surface of the sub-fin; and
    the second and third crystals are over the amorphous material.

8. The transistor of claim 1, wherein:
    the first crystal comprises Si; and
    the second and third crystals both comprise In, Ga, N, and an n-type impurity.

9. The transistor of claim 8, wherein:
    the second and third crystals comprise Si at a concentration of at least $1 \times 10^{20}$ atoms/cm$^3$; and
    the second and third crystals comprise no more than 40% In.

10. The transistor of claim 1, wherein:
    the second and third crystals have a dislocation density no more than $10^{11}$ cm$^{-2}$; and
    the gate stack comprises a metal gate electrode over a high-k gate dielectric material.

11. A CMOS integrated circuit (IC), comprising:
    an nMOS transistor including:
        a first crystal over a substrate, wherein the first crystal comprises group IV or group III-V lattice atoms, and is associated with a first lattice constant;
        a first gate stack over the first crystal;
        a second crystal and a third crystal, the second and third crystals each in contact with an end of the first crystal on opposite sides of the gate stack, wherein the second and third crystals have hexagonal crystallinity, and are associated with one or more second lattice constants that are smaller than the first lattice constant; and
    a pMOS transistor further including:
        a fourth crystal over the substrate, wherein the fourth crystal comprises group IV or group III-V lattice atoms, and is associated with a second lattice constant;
        a second gate stack over the fourth crystal;
        a fifth and a sixth crystal, the fifth and sixth crystals each in contact with an end of the fourth crystal on opposite sides of the second gate stack, wherein the fifth and sixth crystals have hexagonal crystallinity, and are associated with one or more third lattice constants that are no smaller than the one or more second lattice constants.

12. The IC of claim 11, wherein:
    the first and fourth crystals both comprise group IV lattice atoms;
    the first and second gate stacks are over a (100) surface of the first and fourth crystals; and
    the second, third, fifth and sixth crystals comprise nitrogen and group III lattice atoms with a c-axis extending substantially orthogonally from a facet of the first or fourth crystal, the facet being other than a (100) surface of the first or fourth crystal.

13. A method of forming semiconductor device, the method comprising:
    forming a gate stack over a (100) surface of a first crystal comprising a group IV or group III-V material, and having a first lattice constant;
    heteroepitaxially growing second crystal on a first surface of the first crystal on a first side of the gate stack, the second crystal having hexagonal crystallinity and associated with a lattice constant that is smaller than the first lattice constant; and
    heteroepitaxially growing a third crystal on a second surface of the first crystal on a second side of the gate stack, the third crystal having hexagonal crystallinity and associated with a lattice constant that is smaller than the first lattice constant.

14. The method of claim 13, further comprising:
    performing a crystallographic etch of the first crystal to expose a (111) or (110) facet on the first and second surfaces; and
    heteroepitaxially growing the second and third crystals from the exposed (111) or (110) facet.

15. The method of claim 14, wherein performing the crystallographic etch of the channel crystal further comprises exposing a (100) surface; and the method further comprises:

depositing an amorphous material over the (100) surface before heteroepitaxially growing the second and third crystals in a region not covered by the amorphous material.

16. The method of claim 15, wherein:

the gate stack is formed on at least a (100) silicon surface of the first crystal; and heteroepitaxially growing the second and third crystals further comprises growing the second and third crystals laterally over the amorphous material.

17. The method of claim 13, wherein the first crystal comprises group IV lattice atoms; and heteroepitaxially growing the second and third crystals further comprises growing $In_xGa_{1-x}N$.

18. The method of claim 17, wherein:

the $In_xGa_{1-x}N$ comprises silicon at a concentration of at least $1 \times 10^{20}$ atoms/cm$^3$; and x is not more than 0.4.

19. The method of claim 13, further comprising:

forming the first crystal on a fin extending from a substrate, wherein a top surface of the fin is a (100) silicon surface; and performing a crystallographic etch of the first crystal to expose a (111) or (110) facet within the first and second surfaces; and heteroepitaxially growing the second and third crystals from the exposed (111) or (110) facets.

20. The method of claim 13, wherein forming the gate stack further comprises:

forming a sacrificial gate stack prior to forming the second and third crystals; and replacing the sacrificial gate stack with a permanent gate stack after forming the second and third crystals.

21. The method of claim 13, wherein heteroepitaxially growing the second and third crystals further comprises growing an AlIn nucleation layer on the first and second surfaces.

* * * * *